(12) United States Patent
Wood et al.

(10) Patent No.: US 6,979,891 B2
(45) Date of Patent: Dec. 27, 2005

(54) INTEGRATED CIRCUIT PACKAGING ARCHITECTURE

(75) Inventors: Dustin P. Wood, Chandler, AZ (US); Brent Stone, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 206 days.

(21) Appl. No.: 10/657,437

(22) Filed: Sep. 8, 2003

(65) Prior Publication Data

US 2005/0051889 A1 Mar. 10, 2005

(51) Int. Cl.[7] .............................................. H01L 23/02
(52) U.S. Cl. ...................... 257/679; 257/712
(58) Field of Search ................................. 257/679, 712

(56) References Cited

U.S. PATENT DOCUMENTS

| | | | |
|---|---|---|---|
| 5,444,298 A * | 8/1995 | Schutz ........................ 257/691 |
| 5,621,245 A * | 4/1997 | Agatstein et al. ............ 257/723 |
| 5,833,472 A * | 11/1998 | Bright ......................... 439/70 |
| 5,847,951 A * | 12/1998 | Brown et al. ................ 363/147 |
| 6,050,829 A * | 4/2000 | Eldridge et al. .............. 439/67 |
| 6,359,783 B1 * | 3/2002 | Noble ........................ 361/704 |
| 6,586,684 B2 * | 7/2003 | Frutschy et al. ............ 174/260 |

OTHER PUBLICATIONS

Brown, Dirk et al., "An Adaptable, High Performance LGA Connector Technology", HCD, Inc. 6pgs.
"Modular Subsystems and High Frequency Solutions", HCD Connectors, Aug. 2002, 12pgs.

* cited by examiner

*Primary Examiner*—Roy Potter
(74) *Attorney, Agent, or Firm*—Buckley, Maschoff & Talwalkar LLC

(57) ABSTRACT

A system may include an integrated circuit package having a package power contact and a package ground contact, and an interposer to physically receive a portion of the package and including a lip. A system may also include a first card having a card power contact to interface with the package power contact and a card ground contact to interface with the package ground contact, where the first card defines an opening to receive a portion of the interposer, and the lip is to support a portion of the first card.

14 Claims, 5 Drawing Sheets

INTEGRATED CIRCUIT PACKAGING ARCHITECTURE

BACKGROUND

An integrated circuit (IC) package is used to electrically couple an IC die to external components and circuitry. An IC package also serves to protect an IC die and to provide a suitable operating environment thereto. The above functions may include temperature regulation, impedance matching, and routing of I/O and voltage rails. Packaging architectures attempt to strike a balance between cost and performance of these and other functions.

DETAILED DESCRIPTION

Figure 1:
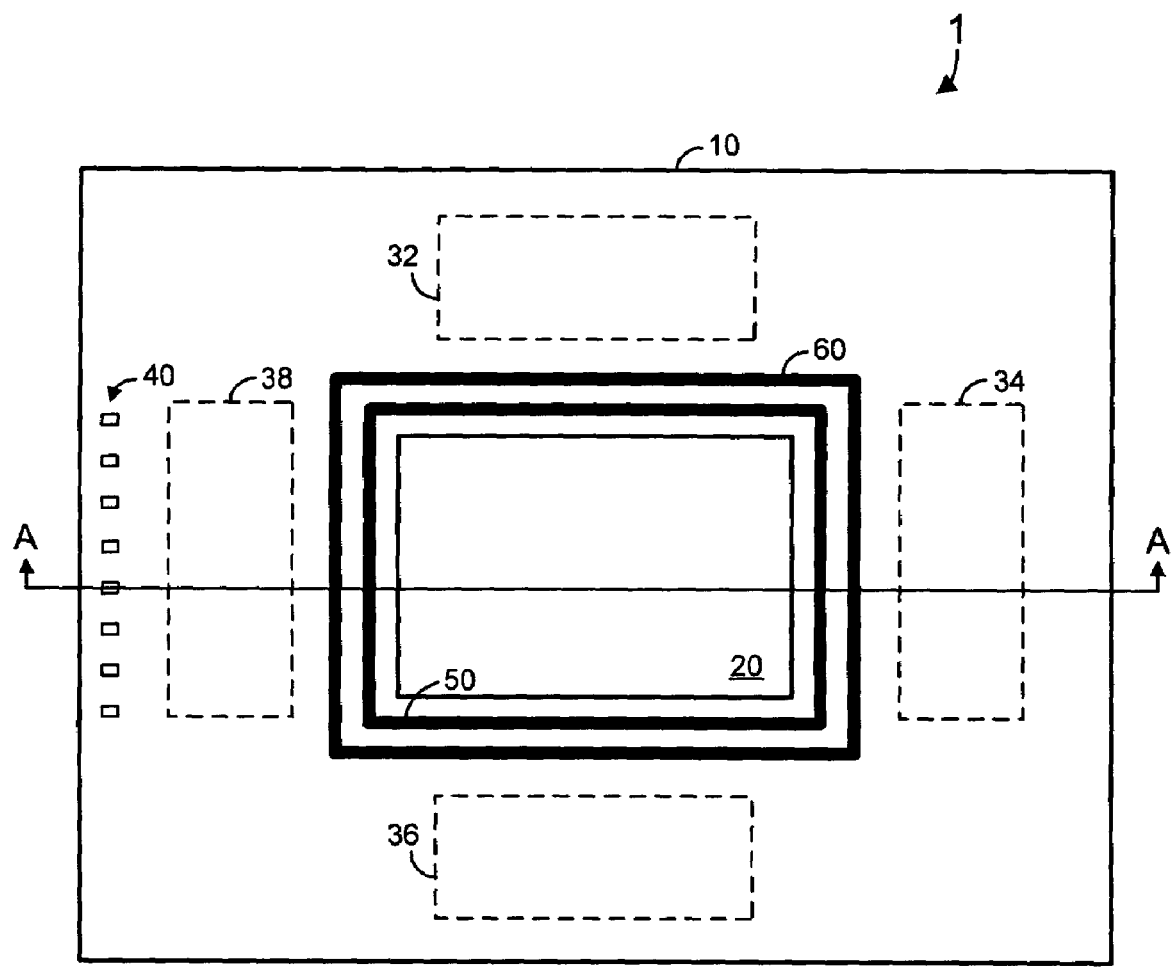
FIG. 1 is a top view of a card according to some embodiments.

FIG. 1 is a top view of apparatus 1 according to some embodiments. Apparatus 1 includes card 10 which may be composed of any suitable substrate material. In some embodiments, card 10 is comprised of two-layer FR4 board with 2 oz. copper deposited on each layer.

Card 10 defines opening 20. Although opening 20 is concentric with card 10 in FIG. 1, some embodiments of apparatus 1 do not possess this characteristic. A shape of opening 20 is also not required to be identical to a shape of card 10 according to some embodiments. In this regard, the respective shapes and positions of card 10 and of opening 20 may depend on the system in which apparatus 1 is used.

Voltage regulator (VR) component blocks 32 through 38 are mounted on card 10. In some embodiments, VR component blocks 32 through 38 receive external power and generate voltage-regulated power for use by a device such as an IC. Each of VR component blocks 32 through 38 may comprise ICs, transistors, resistors, capacitors and/or other VR components that are mounted to card 10 via pin-through or surface mount interfaces. Each of VR component blocks 32 through 38 need not include identical components according to some embodiments. In addition, some embodiments of apparatus 1 may include more or less VR component blocks than the four shown in FIG. 1.

External power may be received over power contacts 40. Power contacts 40 may be disposed above and/or flush with the upper surface of card 10. Power contacts 40 may comprise any conductive structure for achieving an electrical connection with an external connector, such as a copper pad with nickel and/or gold plating. Power contacts 40 may be disposed on both an upper surface and a lower surface (not shown) of card 10.

Signals received from power contacts 40 may be regulated using one or more voltage regulator elements of voltage regulator blocks 32 through 38. One or more of the voltage regulator elements outputs a ground and/or $V_{ss}$ signal to card ground contact 50 to provide a ground and/or $V_{ss}$ signal path to a device that is electrically coupled to card ground contact 50. Similarly, one or more of the voltage regulator elements outputs a power and/or $V_{cc}$ signal to card power contact 60 to provide a signal path to a device that is electrically coupled to card power contact 60. In some embodiments, contact 50 provides a power and/or $V_{cc}$ signal path and contact 60 provides a ground and/or $V_{ss}$ signal path.

One or both of card ground contact 50 and card power contact 60 may comprise continuous bands of exposed conductive material that trace a perimeter of opening 20 as shown in FIG. 1. A band may be covered by a dielectric that is selectively exposed at particular locations along the band in order to create separate contact pads that are electrically coupled to the band. Further conductive material may be disposed at these locations to assist interfacing of the contact pads with contacts of other devices. In some embodiments, contact 50 and or contact 60 comprise two or more contact pads, each of which are coupled by a respective conductive trace to one or more of power contacts 40.

Some embodiments of card 10 include electrical contacts other than those illustrated in FIG. 1. For example, the upper surface and/or the lower surface of card 10 may comprise electrical contacts for receiving control signals from an external source. The control signals may be routed to one or more of voltage regulator blocks 32 through 38.

Figure 2:
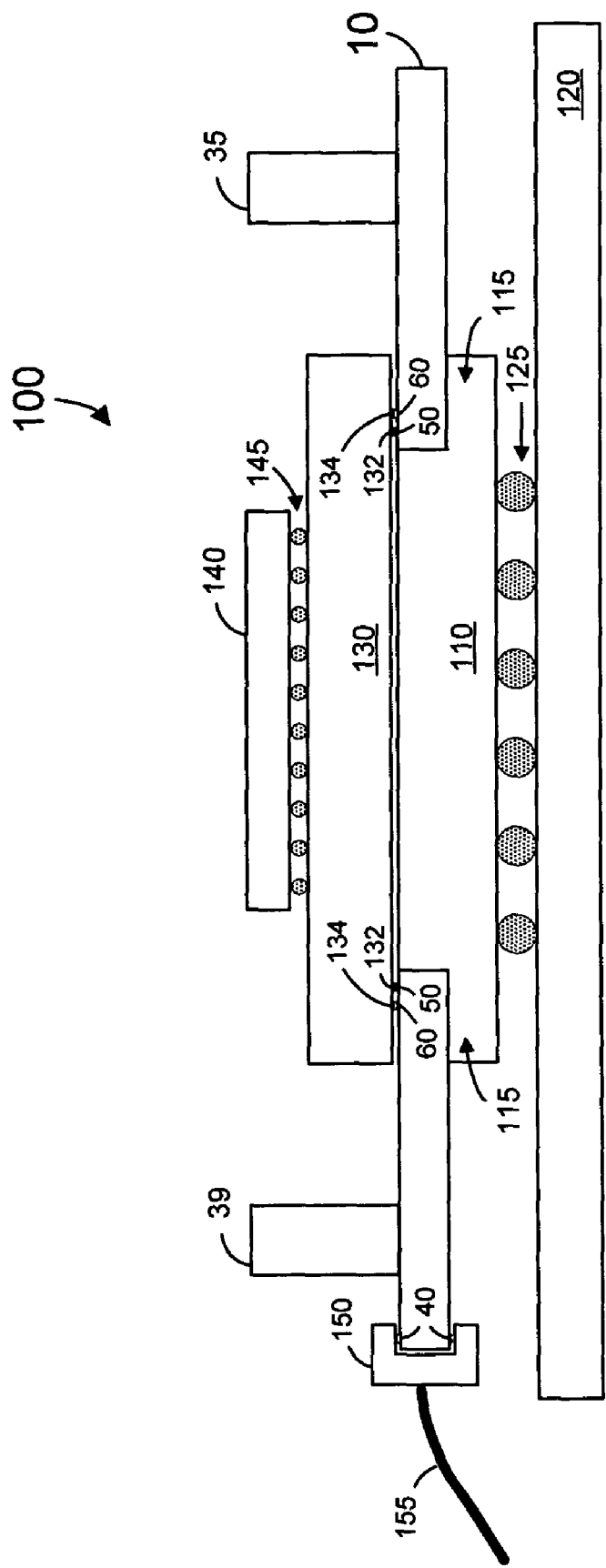
FIG. 2 is a cross-sectional side view of an apparatus according to some embodiments.

FIG. 2 is a cross-sectional side view of system 100 according to some embodiments. The view shows card 10 and VR components 35 and 39 of VR blocks 34 and 38, and is a view of card 10 from the location and in the direction indicated by line "A" of FIG. 1.

System 100 includes interposer 110. Interposer 110 may comprise an IC socket of any currently- or hereafter-known suitable material. Interposer 110 is received into opening 20 of card 10. Interposer 110 may be received by opening 20 so as to substantially prevent motion of card 10 with respect to interposer 110 in the plane of opening 20. Moreover, interposer 110 comprises lip 115 to support a portion of card 10. Lip 115 may or may not be integral with other portions of interposer 110.

Interposer 110 is mounted on motherboard 120 via solder balls 125. In some embodiments, lip 115 may be separately mounted on motherboard 120. As will be described in detail with respect to FIG. 3, solder balls 125 carry I/O signals from interposer 110 to motherboard 120. Underfill material (not shown) may also be used to strengthen the physical bond between motherboard 120 and interposer 110. In some embodiments, interposer 110 comprises through-hole pins for interfacing with a socket mounted on motherboard 120. The foregoing arrangement of card 10, interposer 110 and motherboard 120 may free areas of motherboard 120 that were used to mount voltage regulator elements in previous systems.

Interposer 110 physically receives IC package 130. Package 130 may comprise any ceramic, organic, and/or other suitable material including an interface that is compatible with interposer 110. According to some embodiments, package 130 is an Organic Land Grid Array (OLGA) substrate that may be mounted directly onto a motherboard or mounted on an interposer. Packages other than those mentioned herein may be used in conjunction with some embodiments.

Package 130 comprises package ground contact 132 and package power contact 134. Package contacts 132 and 134 may comprise any conductive structure for achieving an electrical connection with an external conductor, including but not limited to LGA connectors and copper pads with nickel and/or gold plating. Package contacts 132 and 134 may be flush with a lower surface of package 130 or otherwise disposed.

As shown, card ground contact 50 interfaces with package ground contact 132 and card power contact 60 interfaces with package power contact 134. In this regard, LGA connectors may be surface-mounted to either contact of an interface and a connection may be established by compressing the contacts toward each other. The interfacing contacts are soldered to one another according to some embodiments. Dual compression, solderless connections may also be employed.

IC package 130 supports IC die 140, which may be fabricated using any suitable substrate material and fabrication technique and may provide any functions. In some embodiments, IC die 140 comprises a microprocessor chip having a silicon substrate. IC die 140 is electrically coupled to package 130 via Controlled Collapse Chip Connect (C4) balls 145. IC die 140 may comprise a flipchip in which C4 balls 145 are located on a same surface of IC 140 as the active devices integrated therein. In some embodiments, package 130 is electrically coupled to die 140 via wirebonds in addition to or as an alternative to C4 balls 145.

Edge connector 150 is physically coupled to card 10 using any suitable physical interface. Edge connector 150 electrically couples power contacts 40 to respective signal lines within power cable 155. Power cable 155 may in turn be coupled to a power supply in order to receive power and ground signals therefrom.

Figure 3:
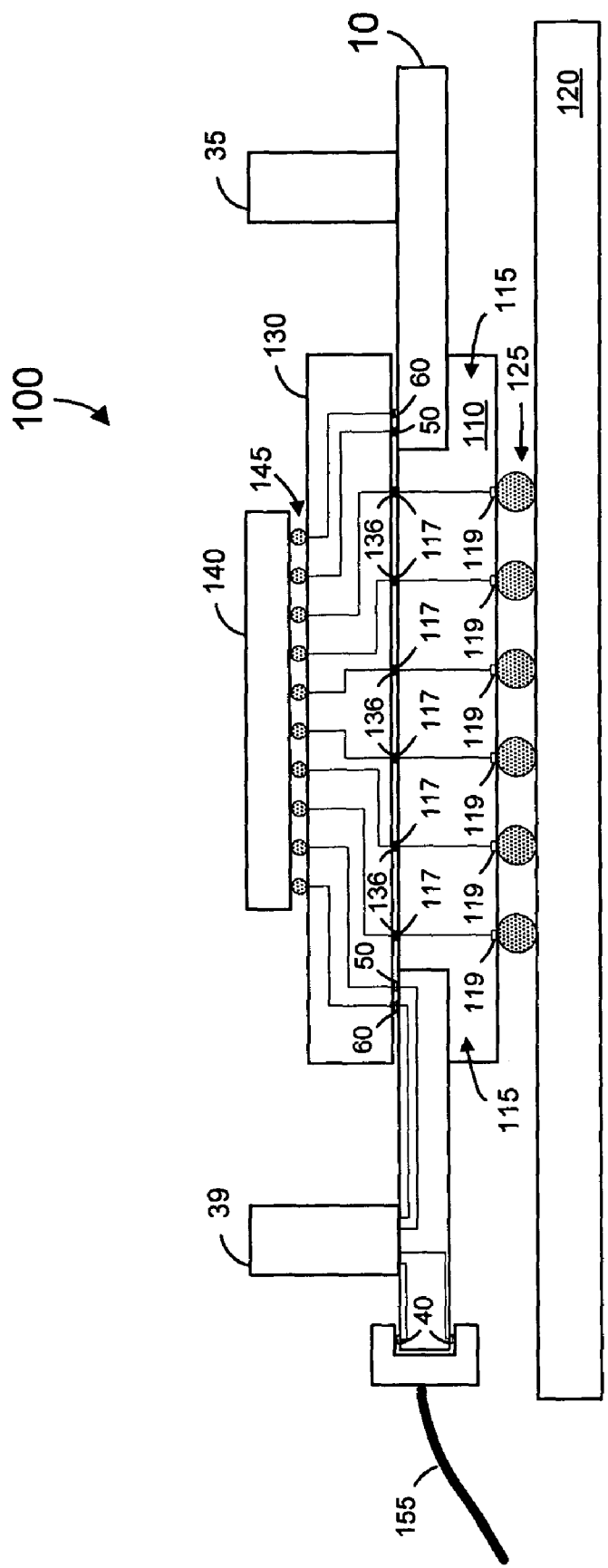
FIG. 3 is a cross-sectional side view of an apparatus according to some embodiments.

FIG. 3 is a side cross-sectional view of apparatus 100 that shows electrical signal paths according to some embodiments. As shown, card ground contact 50 and card power contact 60 are coupled to card 10 to receive regulated power signals therefrom. Power contacts 40 are coupled to card 10 to deliver power signals that are received from cable 155 to card 10. As mentioned above, the received signals may be regulated by elements of voltage regulator blocks 32 through 38. The regulated power signals may be transmitted to dedicated power contacts of IC die 140 as shown in FIG. 3. Such a power delivery arrangement may provide less overall path resistance than prior arrangements.

Package 130 includes package I/O contacts 136. Contacts 136 are electrically coupled to dedicated I/O contacts of IC die 140 and may be identical to or different from contacts 132 and 134. Contacts 136 are electrically coupled to respective ones of interposer I/O contacts 117. Surface-mounted LGA connectors may be used to couple contacts 136 to respective ones of contacts 117. Such couplings may be established by compressing the contacts toward each other. The contacts may be coupled to one another via any other method according to some embodiments, including direct soldering and/or dual compression, solderless connections.

Interposer I/O contacts 117 are in turn electrically coupled to respective ones of interposer I/O contacts 119. Contacts 119 and coupled to motherboard 120 via solder balls 125. As a result of the foregoing arrangement, I/O signals may be transmitted between IC die 140 and signal lines of motherboard 120. Some embodiments therefore do not require power or ground contacts on interposer 110, which may result in a smaller interposer footprint for a given number of I/O contacts or a greater number of I/O contacts for a given footprint.

Figure 4:
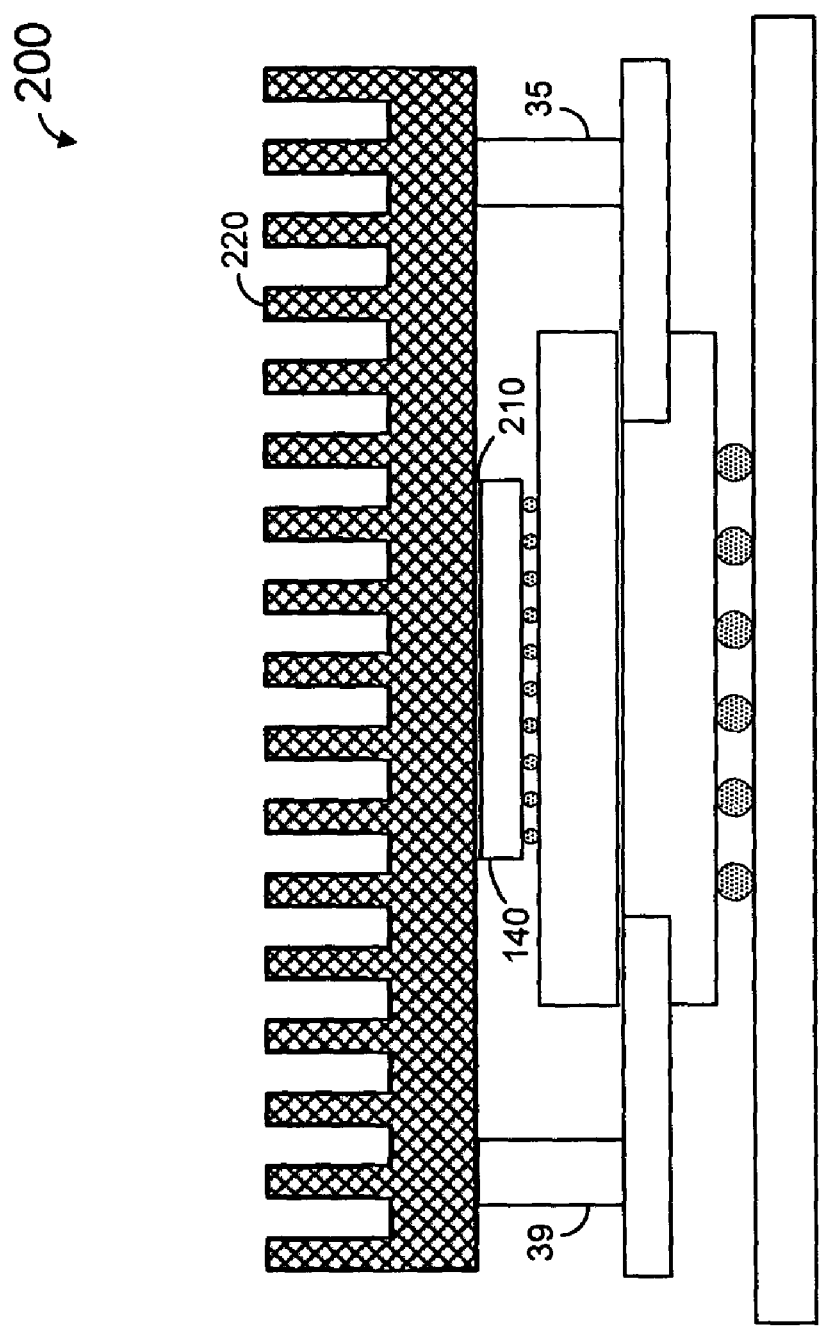
FIG. 4 is a cross-sectional side view of an apparatus according to some embodiments.

FIG. 4 is a cross-sectional side view of apparatus 200 according to some embodiments. Apparatus 200 may be identical to apparatus 100 except for the addition of integrated heat spreader (IHS) 210 and heat sink 220. IHS 210 may comprise a thermally conductive metal for increasing a thermal coupling between die 140 and heat sink 220. A thermally-conductive paste or other material may be disposed between IHS 210 and die 140. Heat sink 220 may comprise any currently- or hereafter-known passive or active heat sink.

Heat sink 220 is also thermally coupled to one or more voltage regulator elements of voltage regulator blocks 32 through 38. In the illustrated embodiment, heat sink 220 is thermally coupled to elements 35 and 39, which may comprise Field Effect Transistors (FETs). Such an arrangement may reduce a need for separate heat sinks dedicated to IC die 140 and to voltage regulator components, respectively.

Figure 5:
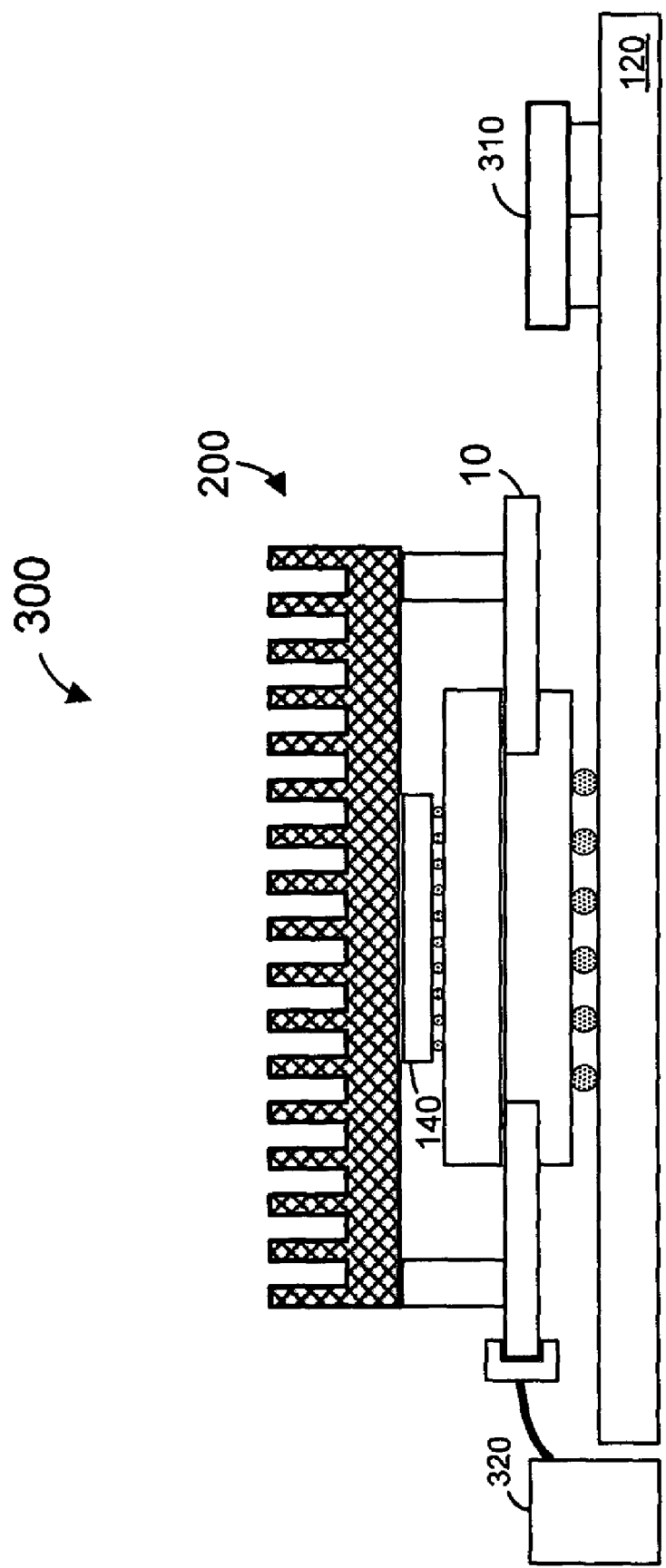
FIG. 5 is a side elevation of a system according to some embodiments.

FIG. 5 illustrates a system according to some embodiments. System 300 includes apparatus 200 of FIG. 4, motherboard 120, memory 310 and power supply 320. System 300 may comprise components of a desktop computing platform, and memory 310 may comprise any type of memory for storing data, such as a Single Data Rate Random Access Memory, a Double Data Rate Random Access Memory, or a Programmable Read Only Memory.

Signal lines of motherboard 120 may be electrically coupled to IC die 140 as described above. The signal lines of motherboard 120 may be coupled in turn to memory 310. In operation, motherboard 120 may route I/O signals between IC die 140 and memory 310. Moreover, power supply 320 may deliver power and ground signals to IC die 140 via card 10. Power supply 320 may also deliver power and ground signals to motherboard 120 and/or to other unshown elements of a device in which system 300 is disposed.

The several embodiments described herein are solely for the purpose of illustration. Some embodiments may include any currently or hereafter-known versions of the elements described herein. Therefore, persons skilled in the art will recognize from this description that other embodiments may be practiced with various modifications and alterations.

What is claimed is:

1. An apparatus comprising:
    an integrated circuit package comprising a package power contact and a package ground contact;
    an interposer to physically receive a portion of the package and comprising a lip; and
    a first card comprising a card power contact to interface with the package power contact and a card ground contact to interface with the package ground contact, the first card defining an opening to receive a portion of the interposer,
    wherein the lip is to support a portion of the first card.

2. An apparatus according to claim 1,
    the integrated circuit package comprising a package input/output (I/O) contact; and
    the interposer comprising an interposer I/O contact to interface with the package I/O contact.

3. An apparatus according to claim 1, the portion of the interposer to be received by the opening so as to substantially prevent motion of the first card with respect to the interposer in the plane of the opening.

4. An apparatus according to claim 1, the interposer further comprising a second interposer I/O contact electrically coupled to the interposer I/O contact, and further comprising:
    a second card comprising a card I/O contact to interface with the second interposer I/O contact.

5. An apparatus according to claim 1, further comprising:
    one or more voltage regulator elements mounted on the first card.

6. An apparatus according to claim 5,
the first card comprising a power interface to receive power directly from a power supply.

7. An apparatus according to claim 5, further comprising:
an integrated circuit die electrically coupled to the package power contact and the package ground contact; and
a heatsink thermally coupled to the integrated circuit die and to one or more of the one or more voltage regulator elements.

8. An apparatus comprising:
an interposer comprising a lip, the interposer to support a portion of an integrated circuit package; and
a card defining an opening, the opening to receive a portion of the interposer, the card to couple to the integrated circuit package, and the lip to support a portion of the card.

9. An apparatus according to claim 8,
wherein the card comprises a card power contact and a card ground contact to respectively interface with a package power contact and a package ground contact of the integrated circuit package.

10. An apparatus according to claim 8,
the interposer further comprising an interposer I/O contact to interface with a package input/output (I/O) contact of the integrated circuit package.

11. An apparatus according to claim 10, the interposer further comprising a second interposer I/O contact electrically coupled to the interposer I/O contact, and further comprising:
a second card comprising a card I/O contact to interface with the second interposer I/O contact.

12. An apparatus according to claim 8, the portion of the interposer to be received by the opening so as to substantially prevent motion of the card with respect to the interposer in the plane of the opening.

13. An apparatus according to claim 8, further comprising:
one or more voltage regulator elements mounted on the card.

14. An apparatus according to claim 13,
the card comprising a power interface to receive power directly from a power supply.

* * * * *